United States Patent [19]

Yoshitoshi et al.

[11] Patent Number: 4,772,784
[45] Date of Patent: Sep. 20, 1988

[54] SEMICONDUCTOR LASER APPARATUS FOR OPTICAL HEAD

[75] Inventors: You Yoshitoshi; Yoshiyuki Matsumoto, both of Tokyo, Japan

[73] Assignee: Sony Corporation, Tokyo, Japan

[21] Appl. No.: 41,140

[22] Filed: Apr. 22, 1987

[30] Foreign Application Priority Data

Apr. 23, 1986 [JP] Japan ................. 61-92410

[51] Int. Cl.[4] .................................. G11B 7/12
[52] U.S. Cl. .............................. 250/211 J; 250/216; 357/19
[58] Field of Search ............... 250/211 R, 211 J, 216; 357/30 L, 30 M; 369/43–46

[56] References Cited

U.S. PATENT DOCUMENTS 3,513,316  5/1970  Hirschfeld .................. 250/211 R
3,969,751  7/1976  Drukaroff et al. ............ 357/30 L
4,334,300  6/1982  Arquie et al. ................. 369/46

Primary Examiner—Edward P. Westin
Assistant Examiner—Charles F. Wieland
Attorney, Agent, or Firm—Hill, Van Santen, Steadman & Simpson

[57] ABSTRACT

A semiconductor laser apparatus having a semiconductor laser diode for radiating a laser beam, a photodetector formed on a semiconductor substrate, a prism having a first plane for introducing the laser beam to a reflecting substance and introducing the beam reflected by the reflecting substance to the photodetector and a second plane facing to the photodetector, and a coating layer formed on the boundary between the semiconductor substrate and the prism, having a refractive index such that the laser beam incident from the first plane other than the laser beam reflected by the reflecting substance is inhibited from reaching the photodetector.

5 Claims, 3 Drawing Sheets

SEMICONDUCTOR LASER APPARATUS FOR OPTICAL HEAD

BACKGROUND OF THE INVENTION

1. Field of the Invention

The present invention relates to a semiconductor laser apparatus for an optical head for performing laser beam radiation and incident laser beam detection.

2. Description of the Prior Art

An optical head used in an optical recording/reproducing system or the like irradiates an optical recording medium with a light beam, and detects a modulated light beam from the optical recording medium to perform information recording/reproducing.

The optical head normally uses a semiconductor laser apparatus. Namely, a laser light beam radiated from a semiconductor laser and reflected by a beam splitter is incident on an optical recording medium through an objective lens. The beam, reflected by the optical recording medium and passing through the objective lens and the beam splitter, is incident on a photodetector.

In the optical head, the semiconductor laser, the beam splitter and the photodetector constitute a semiconductor laser apparatus. In the conventional semiconductor laser apparatus, positional adjustment of the three separate optical components results in a high cost for the optical head.

The assignee of the present application filed a patent application on Apr. 17, 1986 to the U.S. Patent Office, entitled "Semiconductor laser apparatus" and identified as Ser. No. 853,210, now U.S. Pat. No. 4,733,067 which solves the above-mentioned problem. The semiconductor laser apparatus disclosed in this U.S. Pat. No. 4,733,067 is such that a laser diode as a light source and a plurality of photodetectors for detecting a light reflected by an optical disc are formed on a semiconductor substrate. Further, on the semiconductor substrate, there is fixed a prism positioned above the photodetectors for introducing the reflected light from the optical disc to the photodetectors.

The semiconductor laser apparatus as mentioned above has the laser diode as a light source, the respective photodetectors, the prism and so on formed on the same single semiconductor substrate so that it is possible to reduce the size of the optical head as well as simplify its structure, to thereby largely reduce the production cost thereof. However, a stray light incident from a semitransparent reflecting plane, that is, a direct light from the laser diode is incident on the photodetectors so that the detecting sensitivity of the photodetectors is decreased and the detecting error is increased.

OBJECTS AND SUMMARY OF THE INVENTION

Accordingly, it is an object of the present invention to provide a semiconductor laser apparatus which can reduce a stray light from a light source entering a photodetector without providing the semiconductor laser apparatus with particular optical elements.

It is another object of the invention to provide a semiconductor laser apparatus which has a double coating layer formed on the boundary between a photodetector portion formed on a semiconductor substrate and a prism arranged above the photodetector portion and in which the stray light incident from the light source is inhibited from entering into the photodetector portion by the double coating layer.

To achieve the above objects, the present invention provides a semiconductor laser apparatus comprising:

a semiconductor substrate;

a semiconductor laser diode for radiating a laser beam;

a photodetector formed on the semiconductor substrate;

a prism having a first plane for introducing the laser beam to a reflecting substance and introducing a laser beam reflected by the reflecting substance to the photodetector and a second plane facing to the photodetector; and a coating means formed on a boundary between the semiconductor substrate and the prism, having a refractive index such that laser beam incident from the first plane other than the laser beam reflected by the reflecting substance is inhibited from reaching the photodetector.

These and other objects, features and advantages of the present invention will become apparent from the following detailed description of the preferred embodiment taken in conjunction with the accompanying drawings, throughout which like reference numerals designate like elements and parts.

DESCRIPTION OF THE PREFERRED EMBODIMENTS

Now, an embodiment of a semiconductor laser apparatus according to the present invention will hereinafter be described with reference to the appended drawings.

Figure 1:
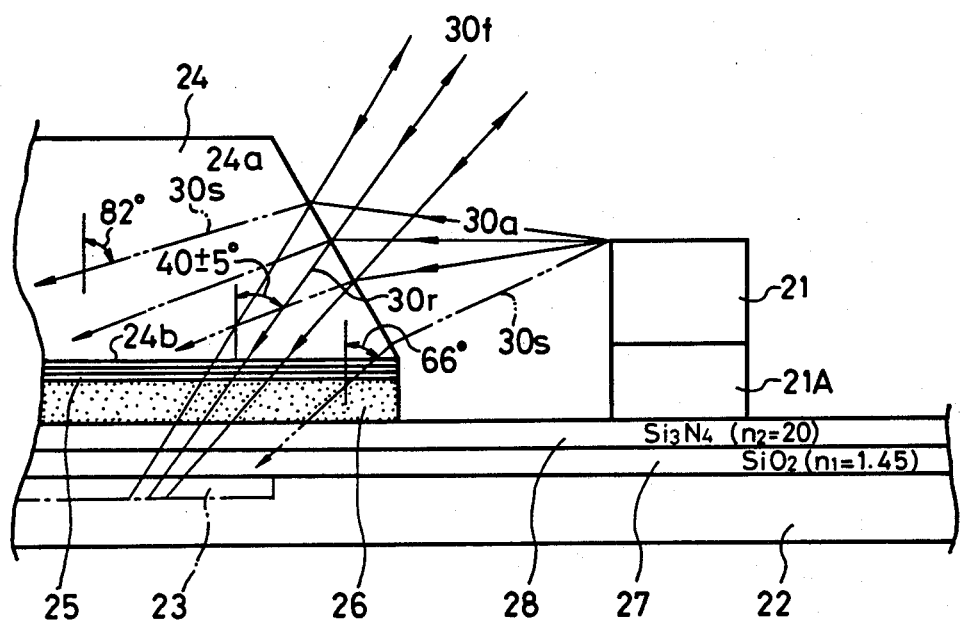
FIG. 1 is a cross-sectional view showing a main portion of a semiconductor laser apparatus according to the present invention.

FIG. 1 is an enlarged cross-sectional view showing a main portion of a semiconductor laser apparatus according to the present invention which comprises a semiconductor substrate 22 made of silicon or the like, a semiconductor laser diode 21 fixed on the semiconductor substrate 22 by a solder 21A, a photodetector section 23 formed on the substrate 22 and a prism 24 which is located on the photodetector section 23 and has a first semitransparent reflecting plane 24a facing to the laser diode 21 and an optical disc, not shown, with a predetermined angle and a plane 24b facing to the photodetector section 23. By the way, although only one photodetector section 23 is shown in FIG. 1, there are actually 3 photodetectors formed on the semiconductor substrate 22.

Further, on the plane 24b, that is, the bottom plane of the prism 24 a half mirror 25 is formed by multicoating which constitutes a second semitransparent reflecting plane of the prism 24. On the upper surface of the semiconductor substrate 22 there are formed a first coating layer 27 made of $SiO_2$ (Silicon Dioxide) and a second coating layer 28 made of $Si_3N_4$ (Silicon Nitride). The above-mentioned half mirror 25 is adhered to the second coating layer 28 by a bonding agent 26.

In the present embodiment, the refractive index n of the bonding agent 26 is selected to be almost equal to that of the prism 24, e.g. 1.56. The refractive index $n_1$ of the first coating layer 27 and the refractive index $n_2$ of the second reflective layer 28 are respectively set at 1.45 and 2.0.

The thickness $d_1$ of the first coating layer 27 is selected as 3720 Å and the thickness $d_2$ of the second coating layer 28 as 1128 Å.

These first and second coating layers 27 and 28 are respectively formed by vacuum evaporation techniques or the like in the predetermined thickness after the photodetector section 23 and so on are formed on the semiconductor substrate 22.

The main portion of the semiconductor laser apparatus is constituted as described above, so that a laser light or beam 30a radiated from the laser diode 21 is reflected by the semitransparent reflecting plane 24a arranged in front of the prism 24 and irradiated on an optical disc and so on, not shown, as a laser light or beam 30f. A returning laser light 30r reflected by the optical disc passes through the same optical path, enters into the prism 24 through the first semitransparent reflecting plane 24a and irradiates the photodetector section 23 through the first and second coating layers 27 and 28 although a portion of the returning laser light 30r is reflected by the half mirror 25 arranged on the bottom plane of the prism 24 at an incident angle of 40°±5°.

On the other hand, a portion of the laser beam 30a radiated from the laser diode 21 passes through the semitransparent reflecting plane 24a of the prism 24 and enters into the prism 24 as a stray laser light 30s as indicated by a two-dot chain line in FIG. 1. The incident angle thereof at that time is made to be approximately from 66° to 82°.

By the way, in the semiconductor laser apparatus according to the present invention, since the first and second coating layers 27 and 28 are formed on the boundary between the semiconductor substrate 22 and the prism 24, as will be later described, it is possible that the stray laser light 30s is almost totally reflected by the first and second reflecting layers 27 and 28 and thereby does not reach the photodetector section 23.

Figure 2:
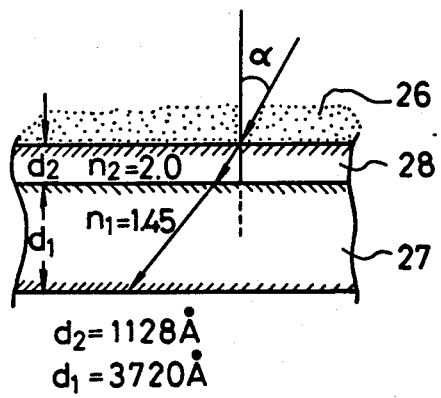
FIG. 2 is an enlarged cross-sectional view of a part of FIG. 1 showing first and second coating layers.

FIG. 2 shows how the laser light (7800 Å) passes through the coating layers 27 and 28 when the coating layer 27 is made of $SiO_2$, the refractive index $n_1$ of which is selected as 1.45 and the thickness of which is selected as 3720 Å, and the coating layer 28 is made of $Si_3N_4$, the refractive index of which is selected as 2.0 and the thickness of which is selected as 1128 Å.

Figure 3:
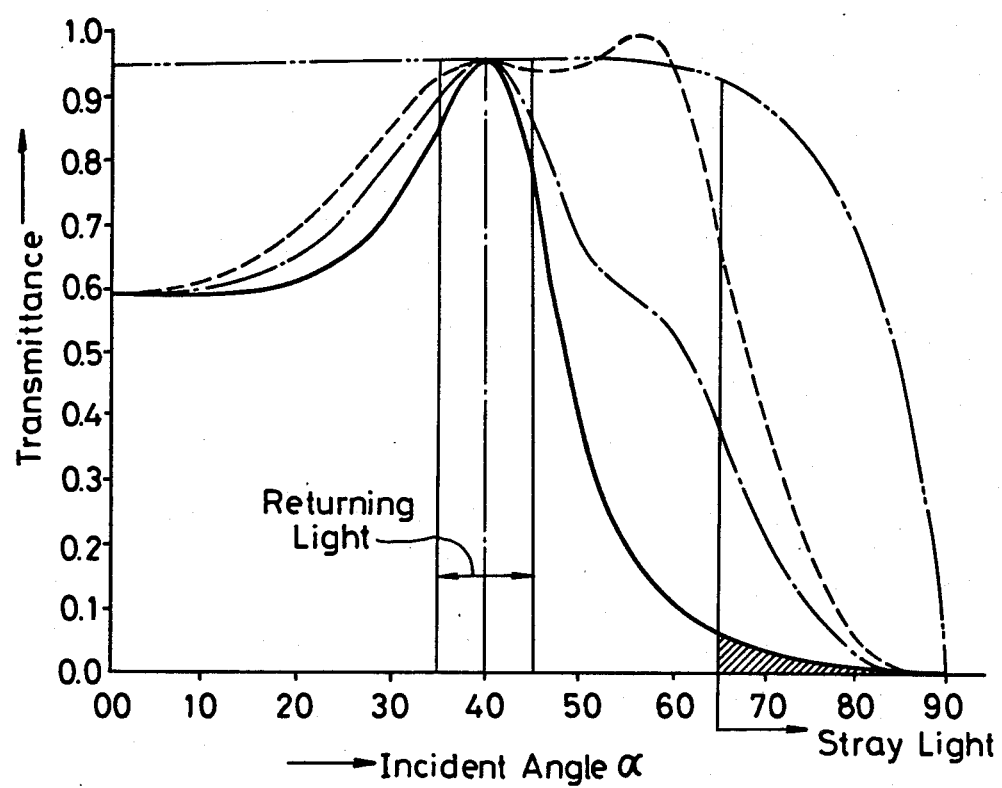
FIG. 3 is a graph showing a relationship between an incident angle $\alpha$ of a laser beam and its transmittance.

FIG. 3 shows how a relationship between the transmittance of the laser light and its incident angle $\alpha$, wherein the ordinate represents the transmittance and the abscissa the incident angle $\alpha$, respectively.

As is understood from FIG. 3, according to the two coating layers 27 and 28 of the present invention, as shown by a solid line curve, the transmittance more than 90% is presented for the laser light, the incident angle $\alpha$ of which is made as 40°±5°, that is, the returning laser light 30r from the optical disc, while for the stray laser light 30s, the incident angle of which is 66° or more, the transmittance is reduced to less than several %, that is, the stray laser light 30s is subjected to almost total reflection by the two coating layers.

Therefore, the photodetector section 23 presents against the returning laser light 30r a high sensitivity, while almost never responds to the stray laser light 30s, so that it is possible to detect the information contained in the reflected laser light from the optical disc with a high sensitivity.

Incidentally, the above data in the graph of FIG. 3 is made for a so-called S-polarized light of the laser light, the plane of polarization of which is in the direction perpendicular to the plane of incidence. While, in FIG. 3 a broken line curve represents the data for a P-polarized light of the laser light. In FIG. 3, a one-dot chain line curve shows an average data between those for the P- and S-polarized lights. Thus, the variation in the transmittance with respect to the incident angle $\alpha$ shows the nearly same tendency as above when average data of S-polarized light data and P-polarized light data are concerned.

In addition, the characteristic shown by a fine two-dot chain line in FIG. 3 shows the case where a single coating layer only is formed on the substrate 22 without the first coating layer 27 (or $d_1 = 0$) formed on the same. In this case, it can be seen that the transmittance scarcely varies as the incident angle $\alpha$ changes up to 70° so that it cannot be expected that the photodetector has the selecting function for the returning laser light.

Figure 4:
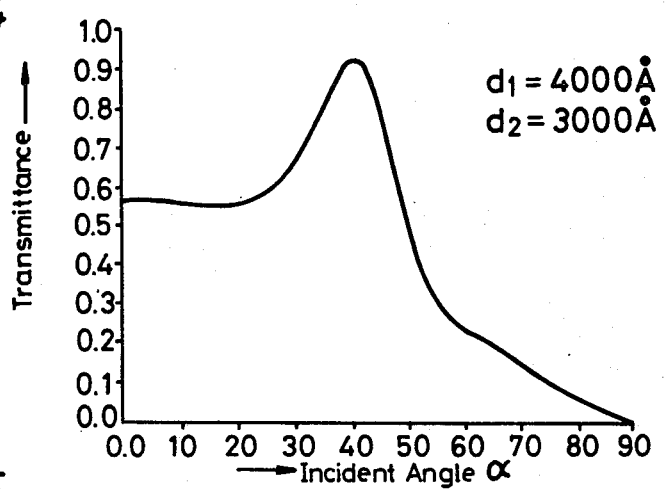
FIGS. 4, 5 and 6 are graphs respectively showing a relationship between the incident angle $\alpha$ of the laser beam and its transmittance when the thicknesses of the first and second coating layers are varied, respectively.
Figure 5:
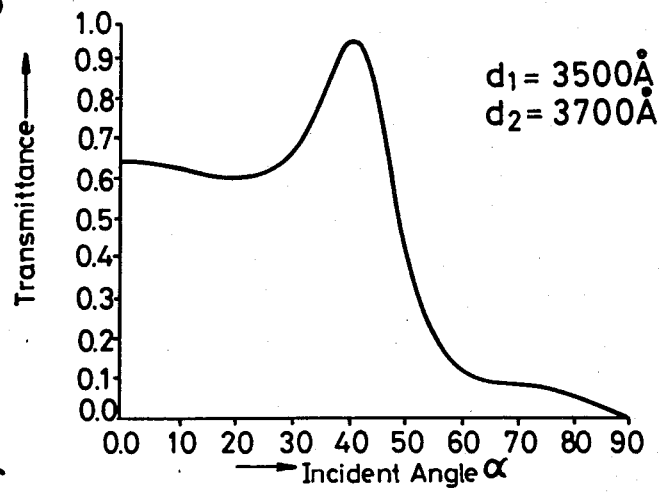
Figure 6:
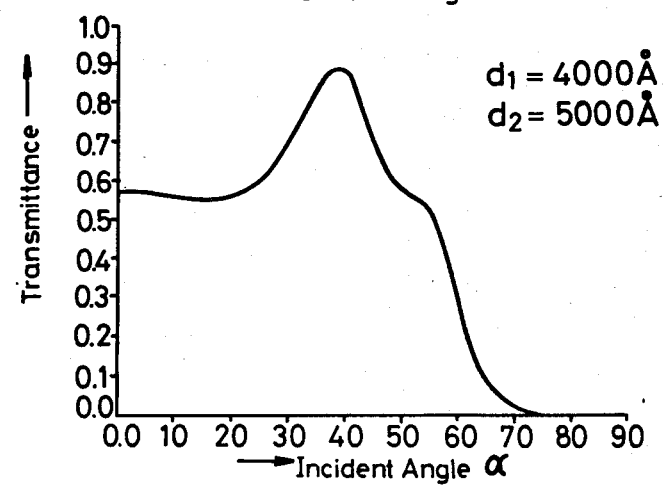

FIGS. 4, 5 and 6 show the characteristics of the transmittance depending upon the incident angle $\alpha$ of the laser light when the thicknesses $d_1$ and $d_2$ of the first and second coating layers 27 and 28 are varied, respectively.

In these embodiments, the ratio of the transmittance for the returning laser light to that for the stray laser light is inferior as compared with that of the embodiment shown in FIG. 3. However, the selecting effect on the returning laser light is enhanced and the sensitivity of the photodetector section can be improved as compared with the case where no coating layer is provided or a single coating layer is provided.

As the explanation set forth above, in the manufacturing process of the semiconductor laser apparatus according to the invention wherein the laser light source, the photodetector and the prism are integrally formed on the semiconductor substrate to reduce the size of the optical head, two coating layers are formed on the boundary between the prism and the semiconductor substrate in a manner that the coating layers are provided to present the total reflection against the stray laser light incident on the prism, to thereby produce an effect of improving the sensitivity of the photodetector for the returning laser light from the optical disc.

Further, if the above-mentioned semiconductor laser apparatus is used as the optical head, it is possible to detect a tracking error signal, a focus error signal and so on with a high accuracy.

The above description is given on a single preferred embodiment of the invention but it will be apparent that many modifications and variations could be effected by one skilled in the art without departing from the spirit or scope of the novel concepts of the invention so that the scope of the invention should be determined by the appended claims only.

We claim as our invention

1. A semiconductor laser apparatus comprising:
   a semiconductor substrate;
   a semiconductor laser diode for radiating a laser beam;
   a photodetector formed on said semiconductor substrate;
   a prism having a first plane for introducing said laser beam to a reflecting substance and introducing a laser beam reflected by said reflecting substance to said photodetector and a second plane facing to said photodetector; and a coating means formed on a boundary between said semiconductor substrate and said prism, having a refractive index such that laser beam incident from said first plane other than said laser beam reflected by said reflecting substance is inhibited from reaching said photodetector.

2. A semiconductor laser apparatus as claimed in claim 1, wherein said coating means is formed of a plurality of layers, each of which has a different refractive index from each other.

3. A semiconductor laser apparatus as claimed in claim 2, wherein said plurality of layers consists of two layers, a first layer is made of $SiO_2$ and a second layer is made of $Si_3N_4$.

4. A semiconductor laser apparatus as claimed in claim 3, wherein said first layer is thicker than said second layer and formed on said semiconductor substrate.

5. A semiconductor laser apparatus as claimed in claim 1, wherein said first plane and said second plane of said prism respectively comprise a half mirror.

* * * * *